United States Patent [19]

Pelc et al.

[11] Patent Number: 5,257,626
[45] Date of Patent: Nov. 2, 1993

[54] METHOD OF NONINVASIVE MYOCARDIAL MOTION ANALYSIS USING BIDIRECTIONAL MOTION INTERGRATION IN PHASE CONTRAST MRI MAPS OF MYOCARDIAL VELOCITY

[75] Inventors: Norbert J. Pelc, Los Altos, Calif.; Douglas C. Noll, Pittsburgh, Pa.; John M. Pauly, Menlo Park, Calif.

[73] Assignee: Board of Trustees of the Leland Stanford Junior University, Stanford, Calif.

[21] Appl. No.: 921,804

[22] Filed: Jul. 28, 1992

Related U.S. Application Data

[63] Continuation-in-part of Ser. No. 865,437, Apr. 9, 1992.

[51] Int. Cl.$^5$ .................. A61B 5/055; A61B 8/00
[52] U.S. Cl. .................. 128/653.2; 128/661.09; 324/312
[58] Field of Search ............. 128/653.2, 653.3, 661.09; 324/306, 307, 312

[56] References Cited

U.S. PATENT DOCUMENTS 4,710,717 12/1987 Pelc et al. .................. 324/309

OTHER PUBLICATIONS

M. O'Donnell, "NMR Blood Flow Imaging Using Multiecho, Phase Contrast Sequences," *Med. Phys.* (Jan.-/Feb. 1985) 12(1):59-64.
C. E. Spritzer, et al., "Rapid MR Imaging of Blood Flow with a Phase-Sensitive, Limited-Flip-Angle, Gradient Recalled Pulse Sequence: Preliminary Experience," *Radiology* (1990) 176(1):255.
N. J. Pelc, et al., "Phase Contrast Cine Magnetic Resonance Imaging," *Magnetic Resonance Quarterly* (1991) 7(4):229.
E. A. Zerhouni, et al., "Human Heart: Tagging with MR Imaging—A Method for Noninvasive Assessment of Myocardial Motion," *Radiology* (Oct. 1988) 169(1):59.
L. Axel, et al., "MR Imaging of Motion with Spatial Modulation of Magnetization," *Radiology* (Jun. 1989) 171:841.
N. J. Pelc, et al., "Encoding Strategies for Three-direction Phase-contrast MR Imaging of Flow," *JMRI* (Jul.-/Aug. 1991) 1(4):405.
V. J. Wedeen, et al., "Measurement of Myocardial Strain with Phase Sensitive MR," *Proc. 9th Ann. Meeting of Soc. Mag. Res. in Med.*, Aug. 18-24, 1990.

*Primary Examiner*—Ruth S. Smith
*Attorney, Agent, or Firm*—Townsend and Townsend Khourie and Crew

[57] ABSTRACT

Measures of a velocity component during a plurality of time frames of cyclical motion of a region of interest are obtained using contrast cine MRI techniques. Trajectories of the region of interest are calculated in a backward direction and in a forward direction. The trajectories are then combined to define a motion trajectory. The forward and backward trajectories are weighted prior to combining with the forward trajectory being more heavily weighted for early frames and the backward trajectory being more heavily weighted for late frames.

21 Claims, 3 Drawing Sheets

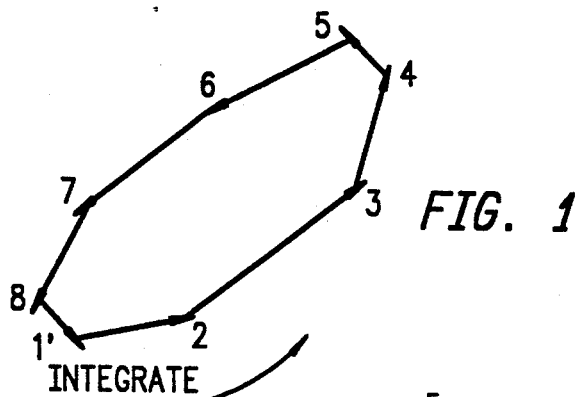
FIG. 1
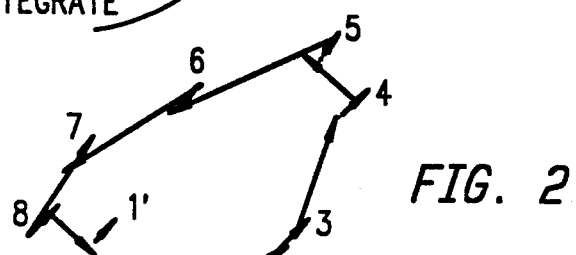
FIG. 2
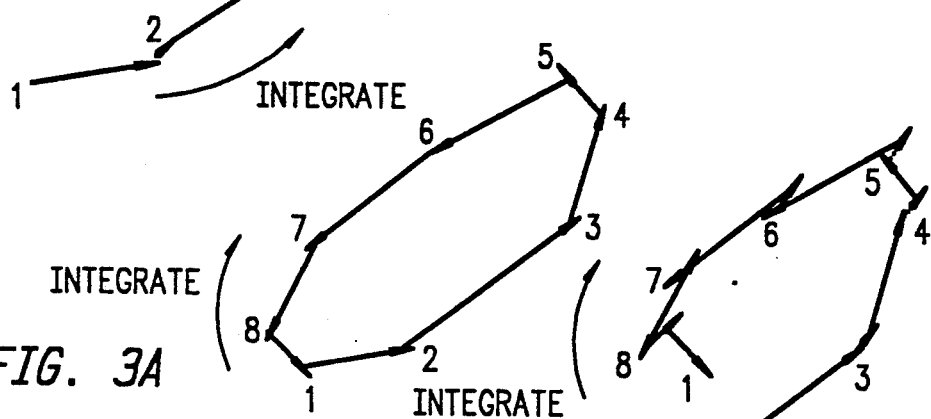
FIG. 3A
FIG. 3B
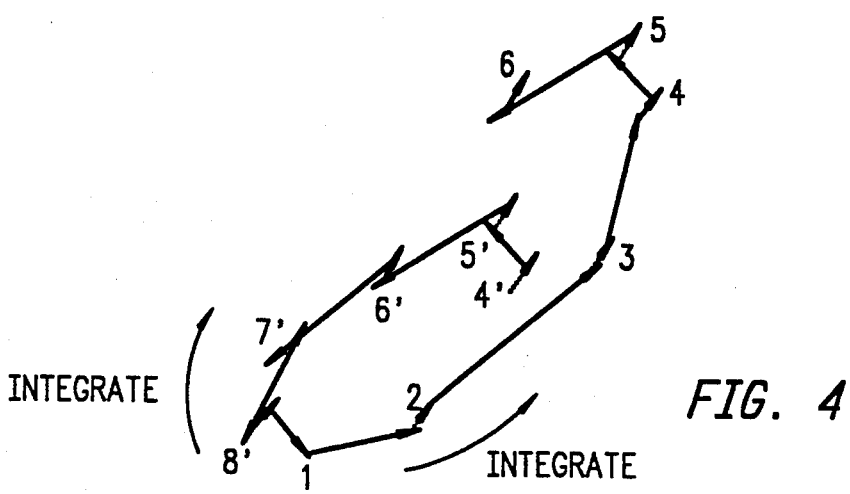
FIG. 4

METHOD OF NONINVASIVE MYOCARDIAL MOTION ANALYSIS USING BIDIRECTIONAL MOTION INTERGRATION IN PHASE CONTRAST MRI MAPS OF MYOCARDIAL VELOCITY

This patent application is a continuation-in-part of application Ser. No. 07/865,437, filed Apr. 9, 1992.

BACKGROUND OF THE INVENTION

This invention relates generally to nuclear magnetic resonance imaging (MRI), and more particularly the invention relates to motion analysis and imaging of an organ such as the heart or a system such as the musculoskeletal system using phase contrast MRI maps of tissue velocity in the organ.

Assessment of the motion of the heart muscle, myocardial motion, is fundamental to the characterization of certain cardiac pathologies and to the development and evaluation of successful interventions. Disclosed in U.S. Pat. No. 4,710,717 is a method of studying the heart using magnetic resonance imaging (MRI). MRI is a noninvasive method which provides measures of global myocardial function and full field anatomical images. Briefly, in the method according to the '717 patent, data are acquired at rapid rates and the incrementation of the amplitude of the phase encoding gradient is controlled using a physiological trigger, e.g. EKG. While this occurs, the temporal position within the cardiac cycle at which each echo was acquired is also measured. Using this timing information and interpolation methods, images that portray the appearance of the object throughout the cardiac cycle can be formed. While useful for cardiac studies, these images still suffer from a disadvantage it shares with most other noninvasive methods of cardiac imaging. Specifically, the method images the tissue that is present in a given physical plane throughout the cycle and not the actual motion of specific tissue samples. Especially as a result of the lack of contrast or features within the imaged structure, many important aspects of the motion cannot be assessed.

Methods that produce images whose intensity is proportional to velocity have also been demonstrated. See, for example, O'Donnell, *Med. Physics,* 12: 59-64, 1985; Spirizer *Radiology,* 176: 255-262, 1990, and Nayler et al., *J. Computer Assisted Tomography,* 10: 715-722, 1986. These methods generally belong to the class of methods called phase contrast MRI. Co-pending U.S. patent application Ser. No. 07/564,945, filed Aug. 9, 1990, for Encoding For NMR Phase Contrast Flow Measurement, discloses a particularly useful and efficient method for simultaneously measuring the three components of velocity, as well as an apparatus with which the method can be performed. Phase contrast principles have been combined with the cine imaging method described above to enable the production of images that portray the distribution of velocities at multiple points in the cardiac cycle. See Pelc, et al., *Magnetic Resonance Quarterly,* Vol. 7, No. 4, 1991, pp. 229-254.

The recently introduced myocardial tagging method with MRI, however, offers a noninvasive technique for obtaining information about the motion of specific myocardial sites similar to that derived from implanted markers. See Zerhouni et al., "Human Heart: Tagging with MR Imaging--A method for Noninvasive assessment of Myocardial Motion", *Radiology* 1988; 169:59-63, and Axel, "MR Imaging of Motion with Spatial Modulation of Magnetization", *Radiology* 1989; 171:841-845.

Co-pending application Ser. No. 07/617,904 filed Nov. 26, 1990, now U.S. Pat. No. 5,195,525 issued Mar. 23, 1993 discloses apparatus and method for analyzing the motion of specific regions using phase contrast cine data. A problem with phase contrast cine MRI relates to additive velocity errors which typically arise due to eddy currents induced by the magnetic field gradients. While many eddy current effects are common to the measurements used to derive velocity information, the gradient changes used to encode velocity can cause differential eddy current effects, and these in turn produce unwanted phase shifts in the images. These unwanted phase shifts appear as additive velocity errors in the images. For example, static structures appear to have small nonzero velocity. Because of the repetitive manner in which the NMR sequences are implemented and the way the cine acquisition is performed, these additive errors can be assumed to be constant throughout the cycle. Also, because of the nature of the magnetic fields that induce the eddy current, the unwanted phase shifts vary very slowly across the images. The additive velocity errors produce errors in the computed motion. The apparent motion between the first and second frame will be composed of a true motion plus a motion error proportional to the additive velocity error. To the extent that the velocity error is constant throughout the cycle and throughout the motion of the object, motion error will accumulate and grow throughout the cycle.

Co-pending application Ser. No. 07/865,437, supra, discloses an iterative algorithm for defining position based on calculated velocity and estimated error. In cyclical motion, as is measured by phase contrast cine MRI, an object must return to its starting position during a cycle. By determining the apparent motion error of a region of interest during the calculated cyclical motion, a velocity error is obtained which can be used to recalculate an improved estimate of the cyclical motion of the region of interest. The process can be repeated iteratively to further reduce the error in the computed motion of the region of interest.

SUMMARY OF THE INVENTION

The present invention uses bidirectional motion integration to compute motion using phase contrast cine MRI. In the calculation of cyclical motion, a preceding frame position as well as the next frame position relative to a present location can be determined based on calculated velocity. Motion trajectories are computed using forward integration and reverse integration, and the frame positions in a cycle are determined by combining the two trajectories. Preferably, the two trajectories are weighted with the backward integration frame location being more heavily weighted near the end of a cycle, and the forward integration frame locations being more heavily weighted near the beginning of the cycle. Halfway through the cycle the forward and backward integration frame location should be equally weighted. Preferably the relative weights for the two trajectories are selected to minimize the effects of noise and eddy current induced errors.

The invention and objects and features thereof will be more readily apparent from the following detailed description and appended claims when taken with the drawings.

BRIEF DESCRIPTION OF THE DRAWINGS

FIG. 1 is a plot illustrating actual cyclical motion of a region of interest.

FIG. 2 is a plot illustrating calculated cyclical motion using conventional phase contrast cine MRI in the presence of additive velocity errors.

FIGS. 3A and 3B illustrate computed cyclical motion using backward integration without and with velocity errors, respectively.

FIG. 4 illustrates portions of the computed cyclical motion trajectories with velocity errors using forward and backward integration.

DESCRIPTION OF SPECIFIC EMBODIMENTS

Figure 5:
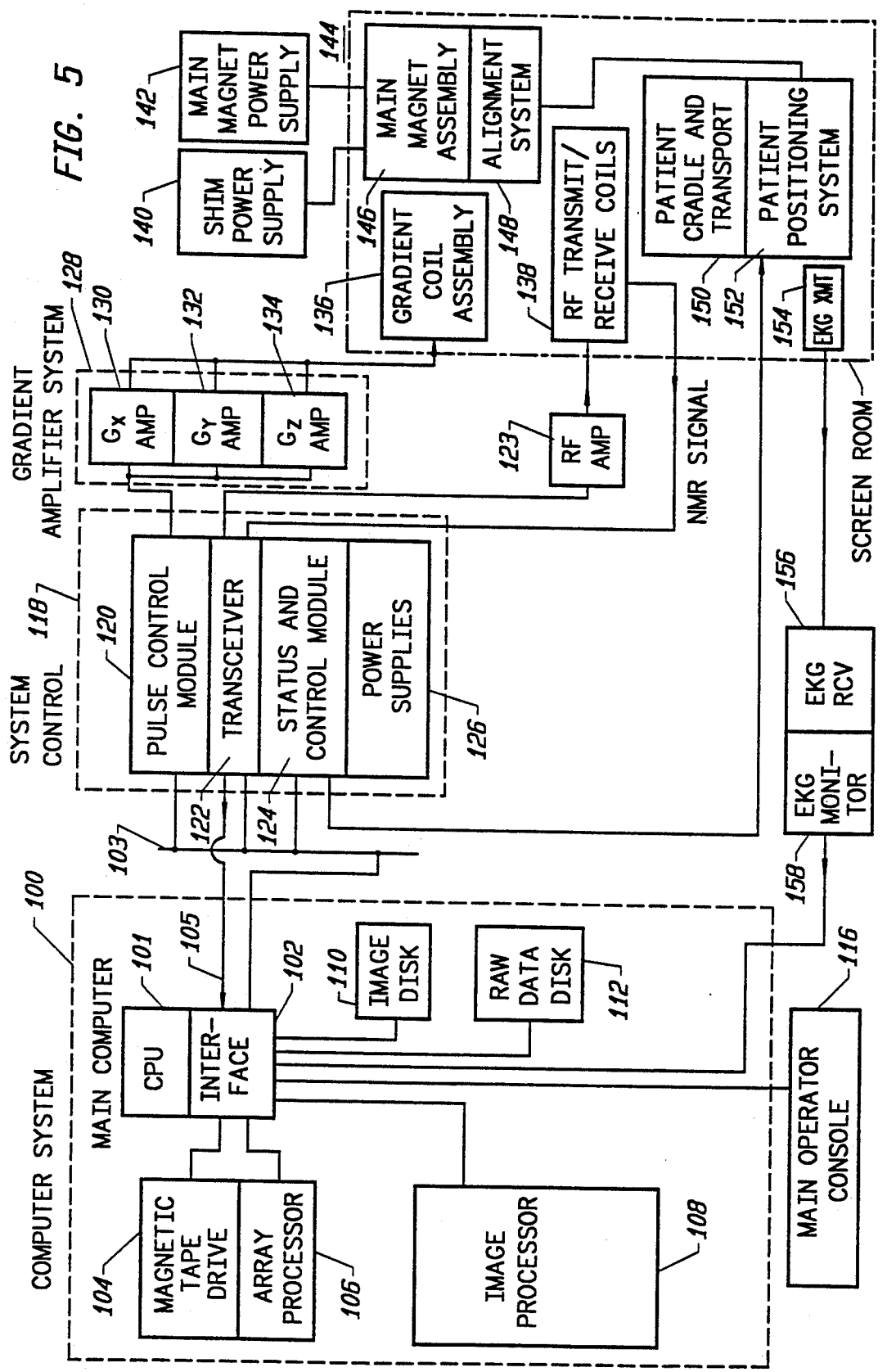
FIG. 5 is a block diagram of an NMR system which employs the invention.

The invention can be carried out using known MRI apparatus such as disclosed in the aforementioned co-pending application Ser. No. 07/617,904, incorporated herein by reference, filed Nov. 26, 1990 for noninvasive motion analysis using phase contrast MRI maps of velocity. As described therein, in tracking cyclical motion, for example myocardial motion, phase contrast cine images of single direction motion (e.g. x) yield pixel by pixel maps of velocity in this direction at regular intervals throughout the cardiac cycle. These data enable recursive derivation of the spatial trajectory of myocardial samples as small as one pixel. A small region of interest (ROI) selected on frame 1 yields the location of the sample in that frame. This, added to the product of the sample's velocity derived from the pixel values in the velocity image in that frame and the time between frames, $\Delta t$, yields an estimate of the expected location of the sample at the second frame. This process can be repeated to generate the path of the sample recursively throughout the entire cycle.

The recursive myocardial motion tracking is generalized to 3 dimensions by treating the images of the three velocity components at a single time, t, in the cardiac cycle as providing a map of the velocity vector $\vec{v}=(v_x, v_y, v_z)$ at each pixel (x, y, z) at that point in time, $\vec{v}(x, y, z, t)$. Letting $\vec{r}=(x, y, z)$, this can also be written $\vec{v}(\vec{r}, t)$. From the location of the sample in the i-th frame $\vec{r}_i=(x_i, y_i, z_i)$, at time $t_i$, the location in frame i+1, $\vec{r}_{i+1}$, is calculated:

$$\vec{r}_{i+1} = \vec{r}_i + \vec{v}(\vec{r}_i, t_i)\Delta t$$

The precision of the resulting trajectory depends on the precision of the velocity estimates. Thus, while single pixel trajectories can be used, enhanced precision can be achieved as the size of the region is increased and the average within the region is used. This average is the average motion of the region, so the ROI should not be so large as to include structures with grossly different behavior. Although the volume is selectable and is limited at the low end to much less than 0.1 cc, regions with volumes of less than 0.25 cc are preferred for the study of myocardial motion.

In motion analysis with phase contrast cine MRI, the operator selects a region to be tracked by identifying its location in the first frame of the cine image set. The velocity in the region in the first frame is used to calculate its expected location in the second frame. The vector velocity in the second frame at the new location as portrayed in the cine set is used to calculate the position in the third frame, and so on. This tracking can be performed in three dimensions (3D) and can yield important information about cardiac or musculoskeletal motion noninvasively. Higher order integration methods can be used to improve the motion estimate. An 8 frame 2D example is shown in FIG. 1. The labeled arrowheads indicate the object position in each of 8 frames as well as the direction of motion. Limitations in this method arise from the additive velocity errors and noise, both of which accumulate during the integration of the trajectory.

One problem addressed by the present invention and in co-pending application Ser. No. 07/865,437, supra, relates to additive errors in phase contrast cine MRI. While many eddy current effects are common to the measurements used to derive velocity information, the gradient changes used to encode velocity can cause differential eddy current effects, and these in turn produce unwanted phase shifts in the images. These unwanted phase shifts appear as additive velocity errors in the images. For example, static structures might appear to have a small nonzero velocity. Because of the repetitive manner in which the NMR sequences are implemented and the way the cine acquisition is performed, these additive errors can be assumed to be constant throughout the cycle. Also, because of the nature of the magnetic fields that induce the eddy currents, the unwanted phase shifts vary very slowly spatially across the images.

The additive velocity errors produce errors in the computed motion. The apparent motion between the first and second frame will be composed of the true motion plus a motion error proportional to the additive velocity error. Because the velocity error is constant as a function of time and varies slowly in space, the motion error will accumulate and grow as the trajectory is computed.

This effect is shown in FIG. 2 for the example of FIG. 1. The error in each frame is shown as a dash line arrow and the errors accumulate to produce the discrepancy between the starting point (1) and the ending point (1') during a complete cycle.

Co-pending application Ser. No. 07/865,437, supra, exploits the fact that the motion is known to be cyclical. Thus, at the end of the cycle the object must return to a starting position. This a-priori knowledge is used to estimate the velocity error, force the computed trajectory to "close" (return to the starting location), and thereby improves the stability and robustness of the method. An iterative algorithm for defining position based on calculated velocity and estimated velocity vector is given therein.

In accordance with the present invention, cyclical motion of a region is calculated in a forward direction and a backward direction, and calculated positions at each frame in the two trajectories are weighted and combined.

Key to the invention is the recognition that while the motion cycle proceeds in a given direction, i.e., frame 1→ frame 2→ frame 3 . . . , the calculation process need not be so limited. Thus, at each frame we can calculate not only where the object will be in the next frame but where it must have been in the previous frame in order to be at its present location. FIGS. 3A and 3B show the computed trajectories using backward integration for the 8 frame example of FIG. 1 with and without additive velocity errors.

The backward integration approach can have substantial benefit for the computation of the object location in frames near the end of the cycle. Comparing FIGS. 2 and 3B, the velocity error has 7 times the impact in the calculation of the object location in frame 8 using forward integration as compared to that using backward integration.

FIG. 4 simultaneously shows parts of both trajectories (forward integration, backward integration) for the 8 frame example with an additive velocity error. Shown are the computed locations in frames 1 through 6 in the forward direction and in frames 4 through 8 in the backward direction (primed numbers) using the same starting position 1. Both trajectories could have been computed for the entire cycle, but a subset are shown for clarity. Note from FIGS. 2, 3B and 4 that the position errors due to eddy current effects are in opposite directions in the two trajectories.

The ideal approach is to combine the calculated positions, for example by forming a weighted sum of the two so that the velocity errors are reduced. Let $r_{fi}$ and $r_{bi}$ be the computed locations in frame i using the forward and backward methods, respectively. The combined trajectory is:

$$r_i = w_i r_{fi} + (1-w_i) r_{bi},  \quad (1)$$

where $w_i$ is the relative weight applied to the forward trajectory in frame i. For the early frames the forward integration should have most weight ($w_i$ close to 1 due to less accumulated error) while for the late frames the backward integration should be weighted more ($w_i$ close to zero). Simple linear progression of weights:

$$w_i = (N-i+1)/N, \quad (2)$$

where frame numbers go from 1 to N, has two optimal features. Suppose the additive velocity error is constant in all frames and equal to $\Delta v$. In frame i the forward integration will have an error of $\Delta r_{fi} = (i-1)\Delta v$ while the backward integration error is $\Delta r_{bi} = -(N-1+1)\Delta v$ (the negative sign arises from integrating backward in time). If the weights of Eq. 2 are used, the error in the combined position estimate at frame i is:

$$\Delta r = w_i \Delta r_{fi} + (1-w_i) \Delta r_{bi}$$
$$\Delta r = (N-1+1)(i-1)\Delta v/N + (i-1)(-N+i-1)\Delta v/N = 0 \quad (3)$$

Thus, the combined trajectory with linear weights is relatively insensitive to additive velocity errors.

An alternate factor that can be used to select weights is minimum noise. If we have two estimates, $A_1$ and $A_2$, of the same quantity, with independent variances $\sigma^2_1$ and $\sigma^2_2$ and want to form a linear combination of them:

$$A = w_1 A_1 + (1-w_1) A_2 \quad (4)$$

it can be shown that the variance of A is minimized when $$W_1 = \sigma^2_2/(\sigma^2_1 + \sigma^2_2). \quad (5)$$

In motion analysis, the variance in the computed position after integration over a time T is approximately:

$$\sigma^2_{xf} = \left( \frac{2v^2_{max} n_s TR}{SNR^2 \pi^2 N_p} \right) T \quad [6]$$

where $v_{max}$ is the peak velocity that can be measured without aliasing, TR is the execution time for a single sequence, $n_s$ is the number of sequences that are interleaved for the phase contrast measurements, SNR is the magnitude signal-to-noise ratio, and $N_p$ is the number of "independent" pixels in the region of interest being analyzed. If the forward integration yields an estimate of the position in frame i with a variance $\sigma^2_{fi}$ (calculated by substituting $T = T_f = (i-1)\Delta T$ into Eq. 6, where $\Delta T$ is the frame time) while the backward integration has a variance $\sigma^2_{bi}$ (calculated by substituting $T = T_b = (N-i+1)\Delta T$ into Eq. 6), and if we assume that these variances are independent, the weights that minimize the variance in the combined estimates are:

$$W_i = \sigma^2_{bi}/(\sigma^2_{fi} + \sigma^2_{bi}) = (N-i+1)/N \quad (7)$$

which are the same weights that minimize the effects of additive errors. The resulting variance in the combined trajectory is:

$$\sigma_x^2 = \left( \frac{2v^2_{max} n_s TR}{SNR^2 \pi^2 N_p} \right) \frac{T_f T_b}{\tau} \quad [8]$$

where $\tau$ is the motion period, and the ratio of this to the forward variance is:

$$R = \frac{\sigma_x^2}{\sigma_{xf}^2} = \frac{T_b}{\tau} \quad [9]$$

At the midpoint in the cycle the variance is halved. At the end of the cycle the reduction in variance is very large.

Thus, linearly varying weights minimize sensitivity to velocity errors and also minimize statistical noise in the computed motion. The benefits are independent in the sense that even if there are no additive velocity errors the method is desirable due to its noise reduction property.

The aforementioned co-pending application, Ser. No. 07/617,904 which disclosed motion tracking using phase contrast cine data also disclosed the use of the spatial gradients of velocity for measuring rotation and deformation. The eddy current induced velocity errors can also trouble these motion estimates. It will be clear to those skilled in the art that the present invention can be used to reduce these errors as well.

Referring to FIG. 5, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (a Data General MV4000). The computer 100 includes an interface 102 through which a plurality of computer peripheral devices and other NMR system components are coupled to the main computer 101. Among the computer peripheral devices is a magnetic tape drive 104 which may be utilized under the direction of the main computer 101 for archiving patient data and image data to tape. Processed patient data may also be stored in an image disc storage device designated 110. An array processor 106 is utilized for preprocessing acquired NMR data and for image reconstruction. The function of image processor 108 is to provide interactive image display manipulation such as magnification, image comparison, gray-scale adjustment and cine display. The computer system 100 also includes a means to store raw NMR data (i.e. before image construction) which employs a disc data storage system designated 112. An operator console 116 is also coupled to the main computer 101 by means of interface 102, and it provides the operator with the means to input data pertinent to a patient study as well as additional data necessary for proper NMR system operation, such as calibrating, initiating and terminating scans. The operator console is also used to display images stored on disc or magnetic tape.

The computer system 100 exercises control over the NMR system by means of a system control 118 and a gradient amplifier system 128. Under the direction of a stored program, the computer 100 communicates with system control 118 by means of a serial communication network 103 (such as the Ethernet network) in a manner well known to those skilled in the art. The system control 118 includes several subsystems such as a pulse control module (PCM) 120, a radio frequency transceiver 122, a status control module (SCM) 124, and power supplies generally designated 126. The PCM 120 utilizes control signals generated under program control by main computer 101 to generate digital waveforms which control gradient coil excitation, as well as RF envelope waveforms utilized in the transceiver 122 for modulating the RF excitation pulses. The gradient waveforms are applied to the gradient amplifier system 128 which is comprised of $G_x$, $G_y$ and $G_z$ amplifiers 130, 132 and 134, respectively. Each amplifier 130, 132 and 134 is utilized to excite a corresponding gradient coil in an assembly designated 136 which is part of a magnet assembly 146. When energized, the gradient coils generate magnetic field gradients $G_x$, $G_y$ and $G_z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency signal to an RF power amplifier 123 which then energizes RF coils 138 which are situated within main magnet assembly 146. The NMR signals radiated by the excited spins in the patient are sensed by the same or a different RF coil than is used for transmitting. The signals are detected, amplified, demodulated, filtered, and digitized in the receiver section of the transceiver 122. The processed signals are transmitted to the main computer 101 by means of a dedicated, unidirectional, high-speed digital link 105 which links interface 102 and transceiver 122.

The PCM 120 and SCM 124 are independent subsystems both of which communicate with main computer 101, peripheral systems, such as patient positioning system 152, as well as to one another by means of serial communications link 103. The PCM 120 and SCM 124 are each comprised of a 16-bit microprocessor (such as Intel 8086) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The main power supply 142 is utilized to bring the polarizing field produced by the magnet to the proper operating strength of 1.5 Tesla and is then disconnected.

To minimize interference from external sources, the NMR system components comprised of the magnet, the gradient coil assembly, and the RF transmit and receiver coils, as well as the patient-handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room.

Also within screen room 144 is EKG transmitter 154 which, through EKG leads (not shown), senses the electrocardiogram (EKG) of the patient (not shown). The sensed EKG signal is transmitted through to EKG receiver 156 to EKG monitor (158), both of which are outside the screen room. EKG monitor processes the EKG signal to derive an EKG trigger which is used by CPU 101 for the timing information necessary for cine MR imaging.

Computer 100 is programmed to execute the motion analysis algorithms described above, and in particular the bidirection integration method of the present invention.

Figure 6:
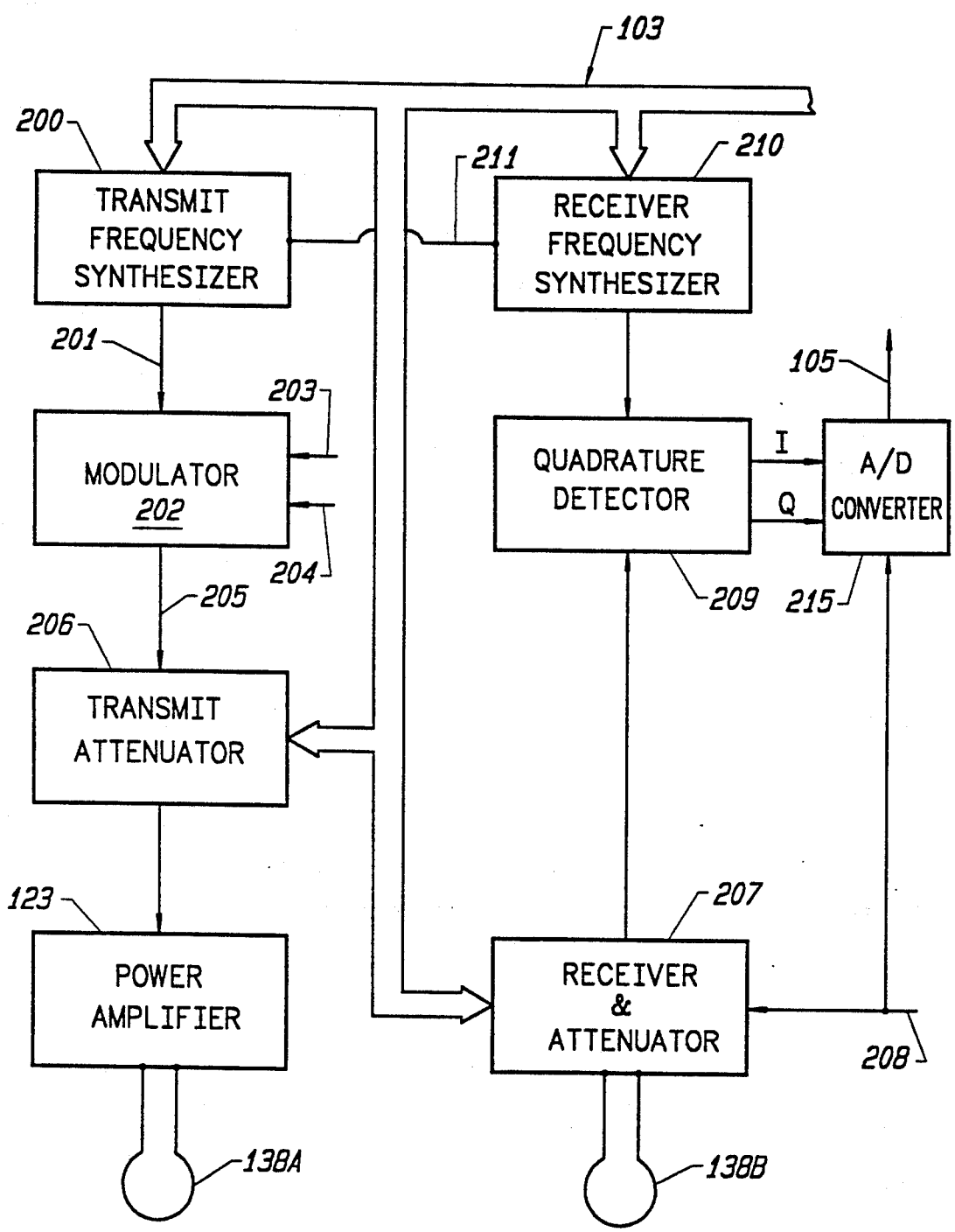
FIG. 6 is an electrical block diagram of the transceiver which forms part of the NMR system of FIG. 4.

Referring particularly to FIGS. 5 and 6 the transceiver 122 includes components which produce the RF excitation field $B_1$ through power amplifier 123 at a coil 138A and components which receive the resulting NMR signal induced in a coil 138B. The base, or carrier, frequency of the RF excitation field is produced by a frequency synthesizer 200 which receives a set of digital signals through the communications link 103 from the main computer 101. These digital signals indicate the frequency which is to be produced at an output 201 at a resolution of one Hertz. This commanded RF carrier is applied to a modulator 202 where it is frequency and amplitude modulated in response to signals received through line 203, and the resulting RF excitation signal is turned on and of f in response to a control signal which is received from the PCM 120 through line 204. The magnitude of the RF excitation pulse output through line 205 is attenuated by a transmit attenuator circuit 206 which receives a digital signal from the main computer 101 through communications link 103. The attenuated RF excitation pulses are applied to the power amplifier 123 that drives the RF transmitter coil 138A.

The NMR signal produced by the excited spins in the subject is picked up by the receiver coil 138B and applied to the input of a receiver 207. The receiver 207 amplifies the NMR signal and this is attenuated by an amount determined by a digital attenuation signal received from the main computer 101 through link 103. The receiver 207 is also turned on and off by a signal through line 208 from the PCM 120 such that the NMR signal is acquired only over the time intervals required by the particular acquisition being performed.

The received NMR signal is demodulated by a quadrature detector 209 to produce two signals I and Q that are coupled through anti-aliasing filters to a pair of analog to digital converters indicated collectively at 215. The quadrature detector 209 also receives an RF reference signal from a second frequency synthesizer 210 and this is employed by the quadrature detector 209 to sense the amplitude of that component of the NMR signal which is in phase with the RF reference (I signal) and the amplitude of that component of the NMR signal which is in quadrature therewith (Q signal).

The I and Q components of the received NMR signal are continuously sampled and digitized by the A/D converter 215 at a sample rate of 64 kHz throughout the acquisition period. A set of 256 digital numbers are simultaneously acquired for each I and Q component of the NMR signal, and these digital numbers are conveyed to the main computer 101 through the serial link 105. Each pair of numbers is thought of as a complex value equal to i+iQ. The NMR system of FIG. 5 performs a series of pulse sequences to collect sufficient NMR data to reconstruct the desired images as described above.

The described invention provides a method of reducing error and noise in phase contrast MRI motion tracking. While the invention has been described with reference to specific embodiments, the description is illustrative of the invention and is not to be construed as limiting the invention. For example, bidirection integration of spatial gradients of velocity can be used to calculate rotation and deformation as well as translation motion. Also, the disclosed method is applicable to other acquisition modalities which produce velocity data, such as Doppler ultrasonography. Thus, various modifications and applications may occur to those skilled in the art without departing from the true spirit and scope of the invention as defined by the appended claims.

What is claimed is:

1. A method of calculating cyclical motion trajectory of a region within an object comprising the steps of:
    a) positioning said object in a magnetic field,
    b) obtaining magnetic resonance image signals representative of at least one velocity component of said region at a plurality of time frames,
    c) obtaining measures of said at least one velocity component during said plurality of time frames,
    d) calculating a forward direction cyclical motion trajectory of said region-of during said plurality of time frames using said measures of said at least one velocity component,
    e) calculating a backward direction cyclical motion trajectory of said region during said plurality of time frames using said measures of said at least one velocity component, and
    f) combining said forward direction and backward direction motion trajectories of said region as calculated in steps d) and e) to produce said cyclical motion trajectory.

2. The method as defined by claim 1 wherein steps d) and e) define positions of said region at each of said plurality of time frames, and step f) includes calculating a position at each time frame from said positions calculated in steps d) and e).

3. The method as defined by claim 2 wherein step f) weights positions calculated in the forward direction and positions calculated in the backward direction when calculating each position.

4. The method as defined by claim 3 wherein positions calculated in the backward direction are weighted more heavily for late frames and positions calculated in the forward direction are weighted more heavily for early frames.

5. The method as defined by claim 4 wherein step f) calculates a combined trajectory, as follows:

$$r_i = w_i r_{fi} + (1-w_i) r_{bi}$$

where
$r_i$ = calculated position in frame i
$r_{fi}$ = calculated location in frame i in forward direction
$r_{bi}$ = calculated position in frame i in backward direction.
$w_i$ = relative weight applied to $r_{fi}$
$1-w_i$ = relative weight applied to $r_{bi}$ 6. The method as defined by claim 5 wherein $$w_i = (N-i+1)/N$$

where
N = total number of frames
i = frame number

7. The method as defined by claim 5 wherein
step d) calculates a motion trajectory $r_{fi}$ with a variance at frame i of $\sigma^2_{fi}$, and
step e) calculates a motion trajectory $r_{bi}$ with a variance at frame i of $\sigma^2_{bi}$, and
$w_i$ are selected by:

$$w_i = \sigma^2_{bi}/(\sigma^2_{bi} + \sigma^2_{fi}).$$

8. The method as defined by claim 1 wherein step f) weights cyclical motion trajectory as calculated in a forward direction and as calculated in a backward direction prior to combining.

9. The method as defined by claim 8 wherein trajectory in the backward direction is weighted more heavily for late frames and trajectory in the forward direction is weighted more heavily for early frames.

10. The method as defined by claim 1 wherein said cyclical motion trajectory includes at least one of translational motion, rotational motion, and deformation motion.

11. Apparatus for calculating cyclical motion trajectory of a region of interest within an object comprising:
    a) means for establishing a magnetic field through said object and said region of interest,
    b) means for obtaining magnetic resonance image signals representative of at least one velocity component of said region at a plurality of time frames,
    c) means for obtaining measures of said at least one velocity component during said plurality of time frames,
    d) means for calculating a forward direction cyclical motion trajectory of said region of interest during said plurality of time frames using said measures of said at least one velocity component, e) means for calculating a backward direction cyclical motion trajectory of said region of interest during said plurality of time frames using said measures of said at least one velocity component, and f) means for combining said forward direction and backward direction motion trajectories of said region of interest as calculated in steps d) and e) to produce said cyclical motion trajectory.

12. Apparatus as defined by claim 11 wherein means d) and means e) define positions of said region at each of said plurality of time frames, and means f) calculates a position from said positions defined by means d) and by means e).

13. Apparatus as defined by claim 12 wherein means f) weights positions calculated in the forward direction and positions calculated in the backward direction when calculating each position.

14. Apparatus as defined by claim 13 wherein positions calculated in the backward direction are weighted more heavily for late frames and positions calculated in the forward direction are weighted more heavily for early frames.

15. Apparatus as defined by claim 14 wherein means f) calculates a combined trajectory, as follows:

$$r_i = w_i r_{fi} + (1-w_i) r_{bi}$$

where $r_i$ = calculated position in frame i $R_{fi}$ = calculated location in frame i in forward direction $r_{bi}$ = calculated position in frame i in backward direction.

$w_i$ = relative weight applied to $r_{fi}$ $1 - w_i$ = relative weight applied to $r_{bi}$ 16. Apparatus as defined by claim 15 wherein means f) calculates a combined trajectory, with:

$$w_i = (N - i + 1)/N$$

where

N = total number of frames i = frame number.

17. Apparatus as defined by claim 11 wherein means f) weights cyclical motion trajectory as calculated in a forward direction and as calculated in a backward direction prior to direction.

18. Apparatus as defined by claim 17 wherein trajectory in the backward direction is weighted more heavily for late frames and trajectory in the forward direction is weighted more heavily for early frames.

19. Apparatus as defined by claim 11 wherein means d) calculates a motion trajectory $r_{fi}$ with a variance at frame i of $\sigma^2_{fi}$, means e) calculates a motion trajectory $r_{bi}$ with a variance at frame i of $\sigma^2_{bi}$, and means f) linearly combines said motion trajectories with a weighting $W_1$ for the forward direction trajectory and a weighting $(1-W_1)$ for the backward trajectory, where $$w_i = \sigma^2_{bi}/(\sigma^2_{bi} + \sigma^2_{fi}).$$

20. A method of calculating cyclical motion trajectory of a region within an object comprising the steps of:

a) directing ultrasound signals to said region, b) obtaining ultrasound doppler signals representative of at least one velocity component of said region at a plurality of time frames, c) obtaining measures of said at least one velocity component during said plurality of time frames, d) calculating a forward direction cyclical motion trajectory of said region during said plurality of time frames using said measures of said at least one velocity component, e) calculating a backward direction cyclical motion trajectory of said region during said plurality of time frames using said measures of said at least one velocity component, and f) combining said forward direction and backward direction motion trajectories of said region as calculated in steps d) and e) to produce said cyclical notion trajectory.

21. Apparatus for calculating cyclical motion trajectory of a region of interest within an object comprising:

a) means for directing ultrasound signals to said region, b) means for obtaining ultrasound doppler representative of at least one velocity component of said region at a plurality of time frames, c) means for obtaining measures of said at least one velocity component during said plurality of time frames, d) means for calculating a forward direction cyclical motion trajectory of said region of interest during said plurality of time frames using said measures of said at least one velocity component, e) means for calculating a backward direction cyclical motion trajectory of said region of interest during said plurality of time frames using said measures of said at least one velocity component, and f) means for combining said forward direction and backward direction motion trajectories of said region of interest as calculated in steps d) and e) to produce said cyclical motion trajectory.

* * * * *